(12) United States Patent
Delahoy

(10) Patent No.: US 7,652,209 B2
(45) Date of Patent: Jan. 26, 2010

(54) METHOD OF JUNCTION FORMATION FOR CIGS PHOTOVOLTAIC DEVICES

(75) Inventor: Alan E. Delahoy, Rocky Hill, NJ (US)

(73) Assignee: Energy Photovoltaics, Robbinsville, NJ (US)

(*) Notice: Subject to any disclaimer, the term of this patent is extended or adjusted under 35 U.S.C. 154(b) by 499 days.

(21) Appl. No.: 11/361,776

(22) Filed: Feb. 24, 2006

(65) Prior Publication Data
US 2006/0144436 A1 Jul. 6, 2006

Related U.S. Application Data

(62) Division of application No. 10/251,337, filed on Sep. 20, 2002, now Pat. No. 7,019,208.

(60) Provisional application No. 60/331,867, filed on Nov. 20, 2001.

(51) Int. Cl.
*H01L 31/00* (2006.01)

(52) U.S. Cl. .................. 136/264; 136/252; 136/265

(58) Field of Classification Search .................. 136/264
See application file for complete search history.

(56) References Cited

U.S. PATENT DOCUMENTS

| | | | |
|---|---|---|---|
| 3,669,060 A | 6/1972 | Page et al. | |
| 5,028,274 A | 7/1991 | Basol et al. | |
| 5,141,564 A | 8/1992 | Chen et al. | |
| 5,436,204 A | 7/1995 | Albin et al. | |
| 5,441,897 A | 8/1995 | Noufi et al. | |
| 6,023,020 A | 2/2000 | Nishitani et al. | |
| 6,048,442 A * | 4/2000 | Kushiya et al. | 204/192.28 |
| 6,107,562 A | 8/2000 | Hashimoto et al. | |
| 6,121,541 A | 9/2000 | Arya | |
| 6,202,591 B1 | 3/2001 | Witzman et al. | |
| 6,258,620 B1 * | 7/2001 | Morel et al. | 438/57 |
| 6,259,016 B1 | 7/2001 | Negami et al. | |
| 6,337,001 B1 | 1/2002 | Haag et al. | |
| 7,019,208 B2 | 3/2006 | Delahoy | |

FOREIGN PATENT DOCUMENTS

WO WO 03/044832 5/2003

OTHER PUBLICATIONS

A. Delahoy, et al., "Ternary Source Materials for CIGS Buffer Layers," Proc. 16th European PVSEC, May 1-5, 2000; Glasgow, UK, pp. 767-770.
Kushiya, et al., "The Role of Cu(InGa)(SeS) 2 Surface Layer on a Graded Band-Gap Cu(InGa)Se2 Thin-Film Solar Cell Prepared by Two-Stage Method," Conference Record of the Twenty-Fifth IEEE Photovoltaic Specialists Conference—1996, Washington, DC: IEEE, May 13-17, 1996, pp. 989-992.

(Continued)

*Primary Examiner*—Jennifer K Michener
*Assistant Examiner*—Miriam Berdichevsky
(74) *Attorney, Agent, or Firm*—Sterne, Kessler, Goldstein & Fox P.L.L.C.

(57) ABSTRACT

Sulfur is used to improve the performance of CIGS devices prepared by the evaporation of a single source ZIS type compound to form a buffer layer on the CIGS. The sulfur may be evaporated, or contained in the ZIS type material, or both. Vacuum evaporation apparatus of many types useful in the practice of the invention are known in the art. Other methods of delivery, such as sputtering, or application of a thiourea solution, may be substituted for evaporation.

12 Claims, 3 Drawing Sheets

OTHER PUBLICATIONS

Delahoy, et al., "Advances in Large Area CIGS Technology," IEEE, 2000, pp. 1437-1440.

M.A. Contreras, et al., "Progress Toward 20% Efficiency in Cu(In, Ga) Se2 Polycrystalline Thin-Film Solar Cells," Prog. Photovolt: Res. Appln. 7, 311-316 (1999).

M. Konagai, et al., "Development of Cu(InGa)Se2 Thin Film Soalr Cells with Cd-Free Buffer Layers," Mat. Res. Soc. Symp. Proc., vol. 426 (1996), Materials Research Society, pp. 153-163.

J.S. Britt, et al., "Large Area Coating of CIGS and ZnO for Pjotovoltaics," 14th European Photovoltaic Solar Energy Conference; Barcelona, Spain, Jun. 30-Jul. 4, 1997, pp. 1287-1290.

* cited by examiner

Evaporation Apparatus

METHOD OF JUNCTION FORMATION FOR CIGS PHOTOVOLTAIC DEVICES

CROSS-REFERENCE TO RELATED APPLICATIONS

The present application is a divisional of U.S. application Ser. No. 10/251,337, filed Sep. 20, 2002 now U.S. Pat. No. 7,019,208, which claims the benefit under 35 U.S.C. §119(e) of Application No. 60/331,867, filed Nov. 20, 2001, the disclosures of both of which are hereby incorporated herein by reference in their entirety for all purposes.

GOVERNMENT SPONSORED RESEARCH

This invention was made with government support under NREL Subcontract No. ZAK-8-17619-21, Prime Contract No. DE-AC36-99GO10337 awarded by the Department of Energy. The government has certain rights in this invention.

BACKGROUND OF THE INVENTION

1. Field of the Invention

The invention is in the field of photovoltaic devices, such as solar cells.

2. Brief Description of the Background Art

Chalcopyrite semiconductors based on $CuInSe_2$ (or CIS) have been investigated for their application to thin film solar cells for over 25 years. Chalcopyrite semiconductors are formed from group I, group III, and group VI elements of the periodic table. Alloying of $CuInSe_2$ and $CuGaSe_2$ to form $Cu(In_xGa_{1-x})Se_2$ (or CIGS) allows the energy gap to be varied between 1.0 eV and 1.68 eV in order to vary the spectral absorption profile. Alloying with $CuInS_2$ to form $Cu(In_xGa_{1-x})(Se_yS_{1-y})_2$ (or CIGSS) allows band-gaps as high as 2.4 eV to be obtained. These semiconductors are direct gap materials; their high optical absorption coefficient allows absorption of sunlight in layers that are only 2 μm in thickness. The electrical properties of the material are determined by composition, intrinsic defects, and structural defects. The cost of solar energy conversion has already been lowered through use of thin film amorphous silicon photovoltaic modules, and a further cost reduction may be anticipated via the use of high efficiency thin film CIGS devices.

Although CIS materials generally deviate from the exact stoichiometry of $CuInSe_2$, it is found that they are usually described by the pseudo-binary system $(1-\delta)Cu_2Se+(1+\delta)In_2Se_3$. Electronically useful films are Cu-poor (Cu/In<1, or more generally, Cu/(In+Ga)<1), and are p-type. All efficient solar cells are made using such p-type material. In Cu-rich films (Cu/(In+Ga)>1) the degenerate semiconductor $Cu_xSe$ forms, leading to films of a metallic nature. Solar cells made using Cu-rich films are of very poor quality.

A solar cell is essentially a rectifying junction in a semiconductor material in which light can be absorbed. The free electrons and holes generated by the absorption of photons are separated by an internal electric field in the semiconductor, giving rise to a photovoltage. In principle, two types of junction can be envisaged using p-type CIGS. If, for example, a surface layer of the CIGS is made n-type through introduction of n-type dopant atoms, then an n-p homojunction is formed. Alternatively, band-bending in the CIGS can be induced by deposition of an n-type semiconductor material of a completely different composition, thereby forming a heterojunction.

The first solar cells made using CIS as the semiconductor employed a layer of n-type CdS deposited by vacuum evaporation to form what was thought to be a heterojunction. Later, to allow the thickness of the CdS to be reduced, the CdS was overcoated with a transparent conductor (Al-doped ZnO). It was also discovered that the use of CdS layers prepared by chemical bath deposition (CBD) using, for example, an aqueous ammonium hydroxide solution containing cadmium acetate as a Cd source and thiourea as a sulfur source, allowed solar cells of higher conversion efficiency to be produced.

The full structure of this type of thin film cell is ZnO/CdS/CIGS/Mo/glass, where the Mo serves as an ohmic contact at the rear of the device. Usually, the ZnO is deposited as a bi-layer consisting of about 500A (Angstroms) of high resistivity ZnO (i-ZnO) followed by about 4000A of highly conductive ZnO (ZnO:Al). The CdS (together with the i-ZnO) is frequently referred to as a buffer layer that is inserted between the active CIGS layer and the ZnO transparent conductor. The use of a Na-containing glass, e.g. soda-lime glass, is another factor that contributes to the achievement of high efficiencies. In 1999, a record 18.8% total-area conversion efficiency was reported for a CIGS solar cell with this structure (M. A. Contreras, B. Egaas, K. Ramanathan, J. Hiltner, A. Swartzlander, F. Hasoon, and R. Noufi, Prog. Photovolt: Res. Appl. 7, 311-316 (1999)). The CIGS was deposited by a three-stage process based on vacuum evaporation (see U.S. Pat. Nos. 5,441,897 and 5,436,204).

While the use of CBD CdS for junction formation has resulted in the highest conversion efficiencies in the laboratory, its use in high volume manufacturing is problematic owing to the presence of cadmium both in the manufacturing plant and in the product. The generation of large volumes of liquid chemical waste is also a nuisance and a significant cost factor. Consequently, the elimination of the wet CBD CdS step in producing CIGS solar devices and its replacement by a dry process represents an important practical goal.

The attainment of this goal has been sought by researchers around the world and has proven elusive. Omission of the buffer layer usually results in solar cells of very poor efficiency. A study of the literature reveals that over twenty other materials and ten deposition processes have been investigated in the hope of forming satisfactory buffer layers. Materials include ZnS, ZnSe, ZnO, $ZnIn_xSe_y$, $Zn(O,S,OH)_x$, $In(OH,S)_x$, $In_2Se_3$, CdSe, $CdCl_2$, $Sn(S,O)_2$, $Zn_2SnO_4$, and a-Si:H. Methods include CBD, evaporation, co-evaporation, sputtering, MOVPE (Metal Organic Vapor Phase Epitaxy), MOCVD (Metal Organic Chemical Vapor Deposition), ALE (Atomic Layer Epitaxy), solvent, and PECVD (Plasma Enhanced Chemical Vapor Deposition). No dry process has yet equaled the combination of high cell efficiency and high device yield achievable with CBD CdS.

It appears that CBD CdS confers multiple and distinct benefits. These may well include:

cleaning of the CIGS surface, possibly involving removal of native oxide, and dissolution of sodium carbonate complete physical coverage of the CIGS provision of a buffer layer of high, but finite, resistivity, thereby lessening the effect of electrical shunts in-diffusion of Cd (possibly by Cu—Cd ion exchange) and n-type doping of the surface by Cd donors provision of a barrier to sputter damage of the CIGS during ZnO deposition removal of interface acceptors, possibly arising from oxygen on Se sites improvement of the minority carrier diffusion length in the film bulk The fact that CBD CdS produces better devices than vacuum evaporated CdS demonstrates that the performance of the buffer layer depends not merely on its chemical composition but on the method of deposition.

It has been reported that Cd and Zn are n-type dopants in CIS. Since the growth of CBD CdS takes place at the low temperature of about 60-80° C., making it unlikely that true epitaxial growth of CdS on CIS takes place, we assume that the highly efficient CIGS devices are, in fact, homojunctions in which the junction is buried at a small depth inside the CIGS, thereby negating the need for epitaxial growth to ensure a low defect density at the junction interface. We further hypothesize that during CBD, Cd diffuses a short distance into the CIS.

SUMMARY OF THE INVENTION

In view of the above, the inventor established a line of work based on a Zn-containing buffer layer to offer the possibility of forming a shallow n-p homojunction in the CIGS absorber. Furthermore, since In and Se are already present in CIS or CIGS, and therefore cannot be regarded as impurities, the use of $ZnIn_xSe_y$ (ZIS) as a buffer material was investigated. (Note that in the abbreviation ZIS, the S stands for selenium.)

This material (ZIS) had been applied to CIGS as a buffer material by Konagai et al. (M. Konagai, Y. Ohtake, and T. Okamoto, MRS Symp. Proc. Vol. 426 (1996) pp 153-163). In this work, the ZIS was formed directly on the CIGS surface by three-source evaporation, i.e., by simultaneous evaporation of the elements Zn, In, and Se from three separate sources.

In distinction to this work, we proposed to chemically synthesize the bulk compound $ZnIn_2Se_4$ (and related compounds), and then to use this material as a single evaporation source material to form a ZIS type buffer layer. Advantages of this method include simplification of the deposition hardware, simpler deposition control, and a fixed film composition.

This proposal was carried out and working CIGS devices were successfully prepared using evaporation of $ZnIn_2Se_4$ onto CIGS to form a ZIS buffer layer. The work was reported at the 16th European Photovoltaic Solar Energy Conference, May 2000, in Glasgow (A. Delahoy, M. Akhtar, J. Bruns, A. Ruppert, L. Chen, Z. Kiss, Conf. Proc. pp 767-770). $ZnIn_2Se_4$ is a representative of a class of compounds known as defect chalcopyrite semiconductors. The defect chalcopyrites are formed from group II, group III, and group VI elements of the periodic table.

The subject of this invention concerns the use of sulfur in improving the performance of CIGS devices prepared by the evaporation of a single source ZIS type compound to form a buffer layer on the CIGS. The sulfur may be evaporated, or contained in the ZIS type material, or both. Vacuum evaporation apparatus of many types useful in the practice of the invention are known in the art. Other methods of delivery may be substituted for evaporation.

DETAILED DESCRIPTION OF THE INVENTION

Synthesis of $ZnIn_2Se_4$ $ZnIn_2Se_4$ was synthesized in two stages: first, the preparation of a $ZnIn_2$ alloy, and second, the reaction of the alloy with Se. The weight ratio of the constituent elements in stoichiometric $ZnIn_2Se_4$ is 1:3.51:4.83, as calculated from the atomic weights of Zn, In, and Se, respectively.

The source materials were 1-5 mm pieces of 99.99% Zn, and In shot 99.999%. 5 g of Zn was used, and 17.55 g of In. The In was cut into pieces of roughly equal size to the Zn, and the Zn and In were placed into a vertical quartz reactor. The reactor was purged with $N_2$ and was heated under $N_2$ flow to 320° C. The mixture was fully liquid. The heater was turned off while stirring. The alloy appeared to solidify at 170° C. The Zn:In alloy formed a sticky layer at the bottom of the quartz reactor and was removed as a solid circular plate.

The edge of the Zn:In plate was cut into small pieces. The stoichiometric amount of Se was calculated to be 24.15 g. A further 3 g was added. The total starting weight was therefore 46.7 g+3 g. The Se was ground well, and mixed with the Zn:In alloy pieces. The Zn:In and Se mixture was placed at the bottom of a glass tube liner, with the remaining large piece of Zn:In alloy on top of the mixture. The liner was placed in a stainless steel reactor. The reactor was purged with $N_2$ and heated under $N_2$ purge. At 100° C. the reactor was sealed. The reactor was heated to 460° C. and then cooled. Most of the product was found as a black, brittle material at the bottom of the tube, with a smaller amount on the walls. The total product of $ZnIn_2Se_4$ was 46 g.

Other ZIS type materials were synthesized using different ratios of Zn and In, i.e., $ZnIn_xSe_y$. Some of these could be described as ZnSe:In or $In_2Se_3$:Zn.

Synthesis of $ZnIn_2(Se_{1-x}S_x)_4$

A ZIS type source material was also prepared in which sulfur was substituted for some of the selenium atoms. We shall abbreviate this material as ZISS. Synthesis of $ZnGa_2Se_4$ (We shall abbreviate this material as ZGS.)

In this case, the Zn, Ga, and Se were mixed and heated to 470° C. The product was ground, mixed well and heated again to 470° C. to form the final product.

Evaporation of ZIS-type Materials

Figure 1:
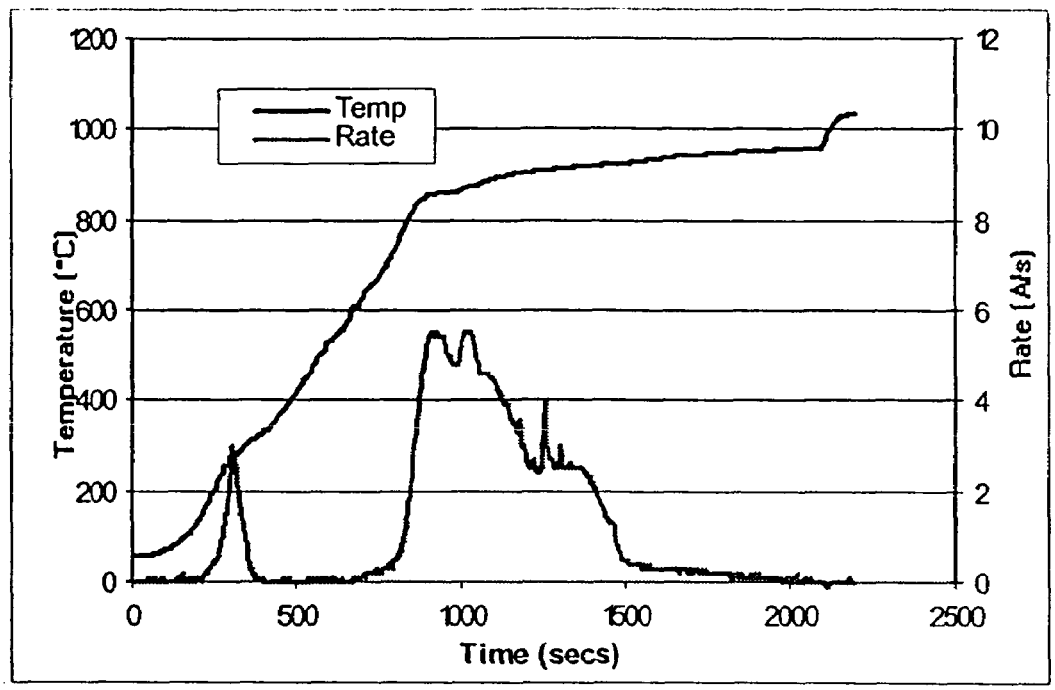
FIG. 1 is a graph of deposition rate as a function of evaporation time and source temperature.

Evaporation of the ZIS was conducted after weighing the desired amount and placing it in an open tungsten boat in the vacuum system. The boat was heated electrically until the complete charge of ZIS had been evaporated. Later, a small graphite crucible heated by an external tungsten foil heater was used with equal success. For solar cells, a mass of ZIS in the range 10 to 20 mg proved satisfactory. Smaller masses resulted in thinner films with greater transparency. In experiments involving sulfur, a mass of S in the range 10-20 mg was employed, and most often 20 mg. It was found that evaporation of a 200 mg charge of ZIS (plus 20 mg S) from the graphite crucible resulted in a film thickness of 2200 Angstroms (2200A or 220 nm). The thickness was measured by stylus profilometry. From this we infer that the ZIS films used in solar cells had a thickness roughly in the range 110A-220A (11 nm-22 nm). Depending on the geometry of the desired device, the vapor flux can be restricted to approximate a point source or a line source The deposition rate of material was studied as a function of source temperature during the complete evaporation of a fresh charge of $ZnIn_2Se_4$. A small emission peak was discovered at a source temperature of about 290° C., followed by the principal emission peak at about 850-860° C., with no other peaks at higher temperatures (see FIG. 1). (Analysis, by in-house EDX, (Energy Dispersive X-ray analysis), of material captured on a glass slide during the initial emission revealed it to be selenium. In conclusion, it appears that $ZnIn_2Se_4$ largely evaporates congruently, and not as different compounds at different temperatures.

In most of the experiments using elemental sulfur, the sulfur was weighed, and both the ZIS and S were placed in the same boat or crucible. In this case, as the crucible was heated, the sulfur fully evaporated from the crucible before the ZIS started to evaporate.

Sputtering of ZIS-Type Materials

It will be appreciated by those skilled in the art that the thin film of ZIS (or ZISS) material can also be deposited by sputtering. Magnetron and hollow cathode configurations represent particularly useful types of sputtering source. Depending on the type of electrical power supply connected to the cathode (on which the target of the material to be sputtered is mounted), the sputtering mode can be DC, mid-frequency asymmetric pulsed power, or RF. Furthermore, materials such as $ZnIn_2Se_4$ can be deposited either by sputtering of a compound target containing all three elements, or by reactive sputtering of a metallic target. In the latter case, the Se is directed at the substrate either in vaporized elemental form or in a compound such as $H_2Se$ gas. The metallic target could be a Zn—In alloy or it could consist of separate Zn and In sub-targets.

Fabrication of Solar Cells With and Without Sulfur

In order to unequivocally test the effect of sulfur, cells within major horizontal rows of Table 1 were processed using the same batch of CIGS, the same deposition procedures, and, except for runs 44 and 45, the same deposition time for sputtered ZnO. (In run 44 the ZnO time was 10 m, while in run 45 it was 7 m). From major row to major row, the batch (and hence quality) of CIGS was different, and parameters such as ZIS thickness and substrate temperature for deposition were varied in order to optimize the process. Whether elemental sulfur is evaporated as well as the ZIS type material is indicated in the Comment column. In all cases, the S was placed in the same crucible as the ZIS, except in run 58 where the sulfur was slowly evaporated in parallel with the ZIS from a second heated source (boat).

TABLE 1

Photovoltaic parameters for solar cells with ZIS or ZISS buffer layers prepared with and without evaporation of sulfur (reference performance with CBD CdS included where available).

| Run # | Buffer | Comment | $V_{oc}$ (mV) | $J_{sc}$ (mA/cm$^2$) | FF (%) | Efficiency (%) |
|---|---|---|---|---|---|---|
| 4 | ZIS | No S | 417 | 25.7 | 42.6 | 4.7 |
| 5 | ZIS | S | 443 | 23.9 | 50.6 | 5.9 |
|   | CdS |   | 446 | 27.5 | 61.5 | 7.5 |
| 9 | ZIS | No S | 432 | 27.5 | 55.5 | 6.6 |
| 10 | ZIS | S | 455 | 31.9 | 58.6 | 8.5 |
|   | CdS |   | 451 | 30.5 | 60.9 | 8.4 |
| 17 | ZIS | S | 442 | 31.8 | 52.6 | 7.4 |
|   | CdS |   | 455 | 35.0 | 58.5 | 9.3 |
| 22 | ZIS | S | 560 | 32.1 | 64.3 | 11.5 |
| 25 | ZGS/ZIS | Bi-layer, S | 465 | 32.7 | 53.5 | 8.1 |
| 44 | ZIS | No S | 395 | 24.8 | 59.6 | 5.8 |
| 45 | ZIS | S | 426 | 27.1 | 55.1 | 6.4 |
| 46 | ZIS | No S | 424 | 25.5 | 52.9 | 5.7 |
| 47 | ZIS | S | 459 | 26.7 | 53.3 | 6.5 |
| 52 | ZIS | No S | 468 | 29.3 | 50.8 | 7.0 |
| 51 | ZIS | S | 493 | 30.4 | 62.9 | 9.4 |
| 57 | ZIS | S | 468 | 26.1 | 51.7 | 6.3 |
| 58 | ZIS | S (2$^{nd}$ source) | 464 | 26.0 | 54.1 | 6.5 |
|   | CdS |   | 478 | 31.2 | 63.1 | 9.4 |
| 59 | ZIS | S | 492 | 29.2 | 54.9 | 7.9 |
| 61 | ZISS | No S | 485 | 28.7 | 54.5 | 7.6 |
| 60 | ZISS | S | 488 | 30.6 | 55.2 | 8.2 |
|   | CdS |   | 519 | 34.3 | 69.0 | 12.3 |
| 63 | ZIS | S | 434 | 29.0 | 52.8 | 6.6 |
| 64 | No buffer | No S | 263 | 22.4 | 32.5 | 1.9 |

Analysis of the data in Table 1 shows that the inclusion of sulfur in the crucible along with the ZIS increases each of the three basic PV parameters, the improvement in average fill factor (FF) and average open-circuit voltage ($V_{oc}$) being about 7%, and the improvement in average short-circuit current density ($J_{sc}$) being about 5%. Since these factors are multiplicative in determining solar cell efficiency (efficiency=$V_{oc} \times J_{sc} \times$FF), a most useful gain in average efficiency is achieved (23%) through the use of sulfur and ZIS relative to ZIS alone.

Note. The fill factor (FF) is defined as $(V_{mp} \times I_{mp})/V_{oc} \times I_{sc}$, where $V_{mp}$ is the voltage at the maximum power point of the solar cell's I-V curve, and $I_{mp}$ is the current at the maximum power point.

Figure 2:
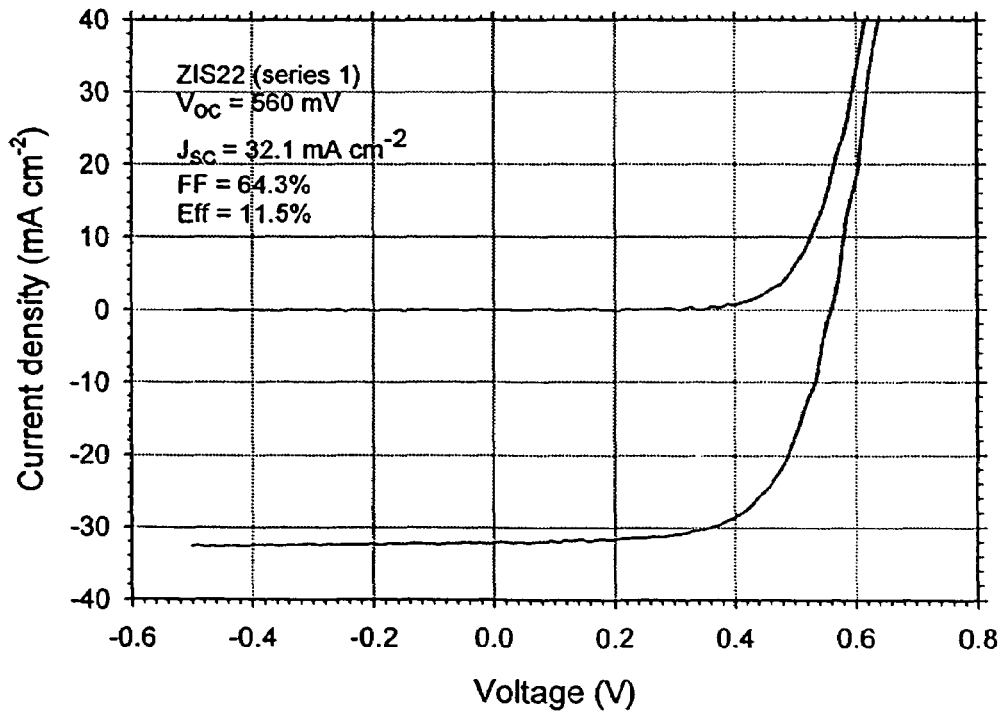
FIG. 2 is a graph of a current-voltage curve of a ZIS/CIGS solar cell with an efficiency of 11.5%

In run 22 a solar cell efficiency of 11.5% was achieved (see FIG. 2). This run did not have a corresponding result for CBD CdS. In run 25 a solar cell efficiency of 8.1% was achieved by the evaporation of sulfur followed by ZGS and then by ZIS. In runs 63 and 64 the overall benefit of the ZIS buffer layer was re-checked. Run 63 (ZIS+S) gave an efficiency of 6.6%, while run 64 (in which the ZIS was omitted) yielded highly variable devices of which the best had an efficiency of 1.9%.

Further experiments were conducted in order to investigate the effects of ZIS deposition temperature, quantity of sulfur, and ZIS thickness. Each series of experiments, as reported in Table 2, was conducted using pieces of CIGS from the same CIGS run. (Different series used CIGS from different runs. Consequently, data cannot be directly compared between series because of the different quality and properties of the CIGS.)

TABLE 2

Photovoltaic parameters for solar cells with ZIS buffer layers with variation of deposition conditions

| Run # | Buffer | Sulfur | Temperature | $V_{oc}$ (mV) | $J_{sc}$ mA/cm$^2$ | FF (%) | Efficiency (%) |
|---|---|---|---|---|---|---|---|
| ZIS deposition temperature series (best device parameters) | | | | | | | |
| 73 | ZIS (10 mg) | 19 mg | 175° C. | 481 | 28.9 | 65.3 | 9.1 |
| 74 | ZIS (10 mg) | 19 mg | 185° C. | 489 | 29.0 | 64.6 | 9.2 |
| 75 | ZIS (10 mg) | 19 mg | 197° C. | 504 | 29.7 | 67.3 | 10.1 |
| 76 | ZIS (10 mg) | 19 mg | 210° C. | 496 | 28.4 | 66.6 | 9.4 |
| Sulfur series (average device parameters) | | | | | | | |
| 79 | ZIS (10 mg) | 0 mg | 197° C. | 454 | 27.1 | 51.0 | 6.3 |
| 80 | ZIS (10 mg) | 5 mg | 197° C. | 474 | 28.5 | 59.0 | 8.0 |

TABLE 2-continued

Photovoltaic parameters for solar cells with ZIS buffer layers with variation of deposition conditions

| Run # | Buffer | Sulfur | Temperature | $V_{oc}$ (mV) | $J_{sc}$ mA/cm$^2$ | FF (%) | Efficiency (%) |
|---|---|---|---|---|---|---|---|
| 81 | ZIS (10 mg) | 19 mg | 197° C. | 463 | 26.2 | 56.5 | 6.8 |
| 82 | ZIS (10 mg) | 30 mg | 197° C. | 472 | 25.1 | 58.0 | 6.9 |
| ZIS thickness series (best device parameters) | | | | | | | |
| 87 | ZIS (7 mg) | 5 mg | 197° C. | 336 | 27.0 | 37.8 | 3.4 |
| 88 | ZIS (10 mg) | 5 mg | 197° C. | 458 | 29.9 | 57.8 | 7.9 |
| 89 | ZIS (14 mg) | 5 mg | 197° C. | 397 | 29.3 | 53.9 | 6.3 |
| Control | CBD CdS | — | — | 477 | 33.2 | 57.1 | 9.0 |
| Additional sulfur treatment of CIGS using thiourea (best device parameters) | | | | | | | |
| 140 thiourea | ZIS (15 mg) | 5 mg | 197° C. | 481 | 30.2 | 58.4 | 8.5 |
| 181A water | ZIS (15 mg) | 5 mg | 197° C. | 409 | 28.6 | 44.4 | 5.2 |
| 181B thiourea | ZIS (15 mg) | 5 mg | 197° C. | 430 | 30.5 | 53.3 | 7.0 |

The temperature series of experiments suggests substrate temperatures in the range 175-210° C. are usable, with an optimum approximately 197° C.

The sulfur series confirms the utility of sulfur in improving efficiency, but suggests that an optimum may exist. The optimum sulfur charge to be loaded into the crucible would seem to be about half the mass of the ZIS charge. In general, the mass of sulfur evaporated should be from 0.3 to twice that of the ZIS, but preferably about half that of the ZIS. The upper end of the range is approximately four times the mass of ZIS or ZISS.

The ZIS thickness series shows that efficiency falls off strongly for the smallest 7 mg charge. This charge corresponds to a thickness of 77A. The optimum charge corresponds to a thickness of about 110A, although reasonable results were also obtained at a ZIS thickness of 154A. The 7.9% cell obtained in run 88 had an efficiency of 88% of a control cell using CdS.

It would not be unreasonable to assume that further development of cells incorporating a ZIS buffer layer would enable efficiencies equal to those with CBD CdS to be obtained.

We note that the bandgap of CdS is 2.5 eV, while that of ZIS is only 2.0 eV. These bandgaps correspond to absorption edges near 520 nm and 620 nm, respectively. The apparent disadvantage of ZIS relative to CdS due to absorption in the wavelength range 520-620 nm can fortunately be compensated through the use of thinner layers of ZIS, so that overall absorption remains comparable. This is demonstrated in the quantum efficiency (QE) data of FIG. 3, in which a QE of 0.7 is achieved at a wavelength of 400 nm. The buffer layer for this cell was ZISS evaporated with sulfur.

Figure 3:
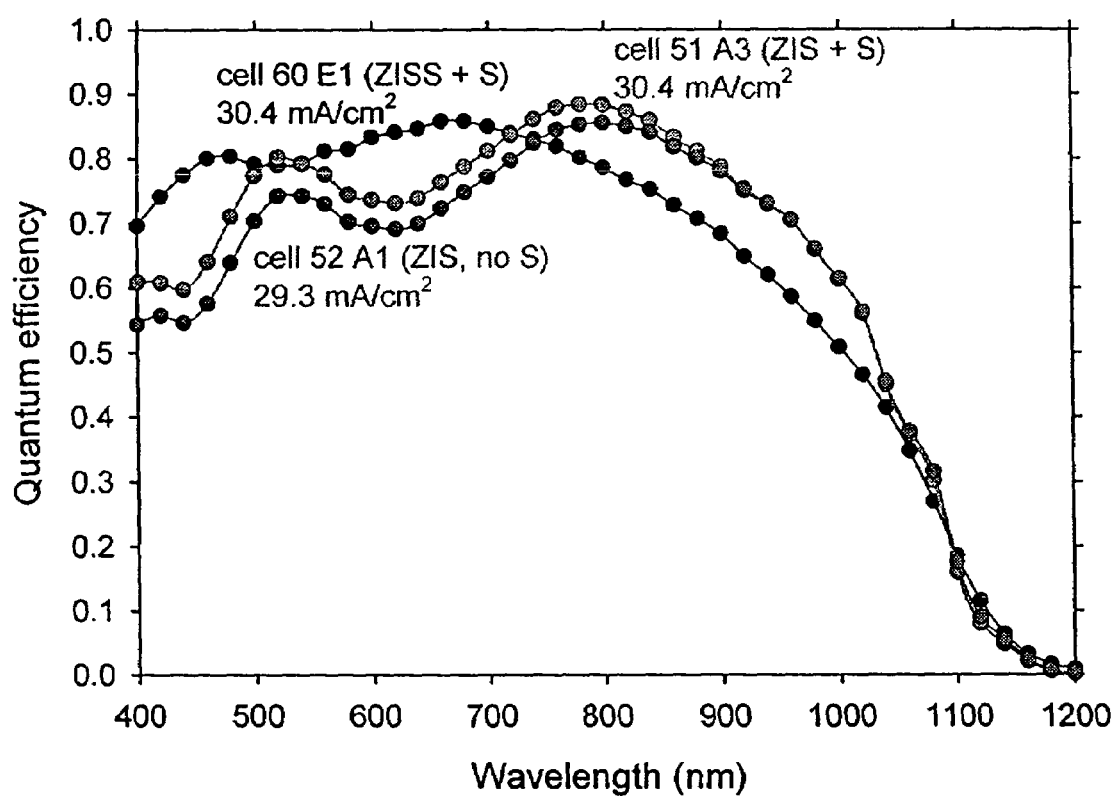
FIG. 3 is a graph of quantum efficiency (QE) curves for a ZISS/CIGS solar cell exhibiting a QE of 0.7 at 400 nm, and for a matched pair of ZIS/CIGS cells fabricated with and without sulfur.
Figure 4:
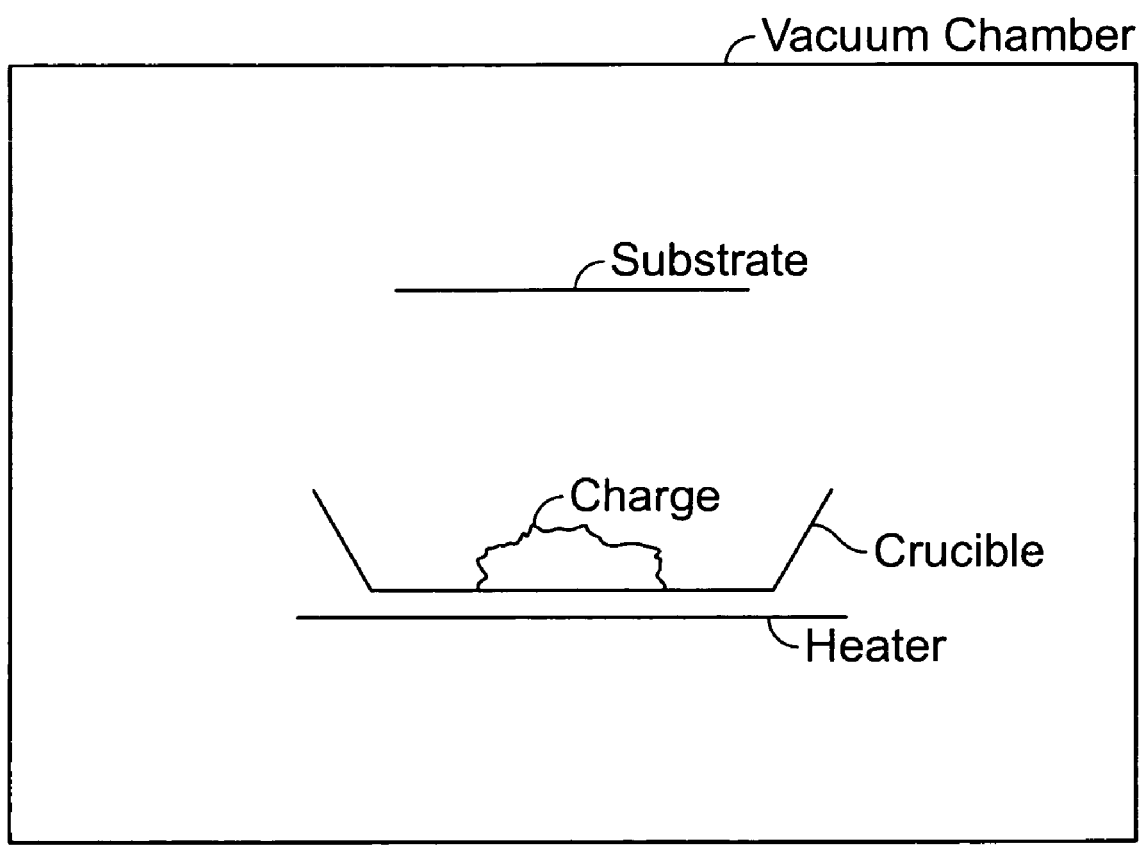
FIG. 4 is a schematic representation of an exemplary vacuum evaporation apparatus.

Detailed analysis of ZIS films co-deposited on a witness glass revealed that many films suffered from sub-gap absorption. It was found that substrate temperature influenced the strength of this absorption. It also appeared that the use of sulfur reduced this absorption, thereby increasing the optical transmission of the film. This particular effect could at least partially account for the increased current density obtained through the use of sulfur. FIG. 3 reveals the increased transparency of ZIS+S relative to ZIS alone, as evidenced by the enhanced QE for short wavelengths. It is notable that the efficiency obtained with ZISS+S (run 60) slightly exceeded that obtained with ZIS+S (run 59). This demonstrates that ZISS is also a useful material for buffer layer deposition. The ZISS source composition was Zn In$_2$ Se$_{3.6}$ S$_{0.4}$. Pretreatment of the ZISS source material at a temperature significantly lower than the evaporation temperature for a time sufficient to drive off superficial Se, can be beneficial. The pretreatment temperature is preferably from 250° C. to 600° C.

Wherever cell results on a particular batch of CIGS are available pertaining to a standard buffer using CBD CdS, these have been included in Table 1. Further analysis of the data in Table 1 shows that the use of ZIS (or ZISS) with sulfur on average resulted in a solar cell efficiency equal to 78% of that obtained with CBD CdS. The deficiencies appear to be mostly in fill factor and short-circuit current. However, it is fully possible that further experimentation will close the efficiency gap between evaporated ZIS and CBD CdS. Buffer layers consisting essentially of ZnIn$_2$ (Se$_{1-x}$, S$_x$)$_2$, with x less than approximately 0.6 and particularly advantageous. The buffer layers are preferable from 4 nm to 30 nm thick.

Although identification of the mechanism by which the evaporation of sulfur prior to the deposition of ZIS improves the solar cell is not needed to support this invention, nevertheless it is believed that at least two processes occur. One of these is reaction of the S with the CIGS (possibly passivating defect states), and the second is modification of the ZIS. Because of the high vapor pressure of S at relatively low temperatures, it is likely that some sulfur impinges on the growing ZIS film (i.e. after completion of the sulfur evaporation) through its re-release from hot surfaces in the deposition chamber e.g. substrate heater assembly. Indeed, we have demonstrated that exposure of a pre-deposited ZIS film to sulfur (at the substrate temperature equal to that used for ZIS deposition) decreases the dark conductivity and increases the photoconductivity of the ZIS film. Data from this experiment is shown in Table 3 below. The increased photoconductivity could be partly responsible for the gain in fill factor observed when sulfur is used.

Deposition of the buffer layer can be done as part of a continuous process, while the deposition system is maintained under vacuum between deposition of the CIGS and buffer deposition. However, if buffer is to be applied to the CIGS layer from solutions, such as by application of a thiourea solution (e.g., by dipping or spraying), the CIGS must first be removed from the vacuum deposition apparatus.

TABLE 3

Dark and photo-currents for a ZIS film before and after sulfur treatment (40 V applied, light one sun irradiance)

| Condition of ZIS film | Dark current (nA) | Photocurrent (nA) |
|---|---|---|
| As-deposited (46 mg ZIS evaporated at $T_s$ = 194° C.) | 0.07 | 0.12 |
| After sulfur treatment (36 mg S evaporated at $T_s$ = 194° C.) | 0.02 | 0.72 |

It was also found that a pre-treatment of the CIGS in a sulfur-containing solution of thiourea (H$_2$NCSNH$_2$) was effective for most samples of CIGS in further improving the performance of CIGS solar cells with ZIS buffer layers. In developing this treatment, the following variables were explored: solution molarity, solution temperature, and CIGS immersion time. Most effective was a 1M/85° C./30 min combination. Table 2 above shows the result obtained in run 140 using such a treatment applied before a standard ZIS deposition. The cell efficiency was 8.5%. The benefit of the treatment relative to a simple water dip is evident from the results of run 181 (conducted on matching samples of CIGS). In run 181A (water dip) the cell efficiency was 5.2%, whereas in run 181B (thiourea treatment of the CIGS) the cell efficiency was 7.0%.

EXAMPLE

This example describes the fabrication of the solar cell reported in run 51 of Table 1. The starting sample consists of a piece of glass bearing a sputtered Mo back contact and a film of CIGS of about 2.5 μm in thickness. The sample was rinsed in de-ionized water for one minute, dried in a stream of nitrogen, and mounted in a vacuum evaporator. The source crucible was made of graphite. 10 mg of $ZnIn_2Se_4$ (ZIS) was placed in the crucible, together with 19 mg of sulfur. The system was pumped to a pressure of $1.2 \times 10^{-6}$ Torr using a diffusion pump, and the substrate was heated to 185° C. The crucible was heated using a resistive heater causing the evaporation of the sulfur followed by the ZIS. The sample was cooled to about 50° C. before removing it from the chamber. A single layer of transparent and conductive ZnO:Al was sputtered for 9 minutes onto the ZIS. The sample was removed from the sputtering chamber and devices were defined by mechanical scribing. The devices (solar cells) were characterized by standard current-voltage and quantum efficiency measurements. The devices exhibited a conversion efficiency of 9.4% (see Table 1 for details). A companion cell was prepared in identical fashion using the same batch of CIGS but using ZIS only with no sulfur. The efficiency of these devices was 7.0%, resulting from significantly inferior fill factor and voltage, and slightly lower current (FIG. 3 reveals the reduced short wavelength response).

What is claimed is:

1. A method for producing a thin film photovoltaic device, comprising the steps of:
    a) depositing a conductor layer;
    b) depositing a chalcopyrite semiconductor layer;
    c) treating the chalcopyrite semiconductor layer with sulfur;
    d) depositing a buffer layer; and
    e) depositing a transparent conductor layer; wherein the buffer layer consists essentially of $ZnIn_xSe_y$ from a single source material.

2. The method of claim 1, wherein the sulfur is supplied by vapor deposition.

3. The method of claim 1, wherein the sulfur is supplied by applying a thiourea solution.

4. The method of claim 3, wherein the thiourea solution is applied by dipping or spraying.

5. The method of claim 1, wherein the single source material is selected from the group consisting of $ZnIn_2Se_4$, ZnSe: In, and $In_2Se_3$:Zn.

6. The method of claim 3, wherein the single source material is $ZnIn_2Se_4$.

7. The method of claim 1, wherein the chalcopyrite semiconductor layer is copper (indium, gallium) selenide.

8. The method of claim 1, wherein the substrate is maintained at a temperature of 175° C. to 210° C. during at least a portion of the buffer layer deposition.

9. The method of claim 1, wherein the transparent conductor layer is zinc oxide.

10. The method of claim 1, further comprising synthesizing the single source material by forming a zinc-indium alloy, and reacting the zinc-indium alloy with selenium.

11. The method of claim 10, wherein the forming comprises heating zinc and indium in an inert $N_2$ atmosphere at a temperature and pressure sufficient to form a liquid.

12. The method of claim 10, wherein the reacting comprises heating the zinc-indium alloy with selenium in an inert $N_2$ atmosphere.

* * * * *